(12) United States Patent
Horiguchi (10) Patent No.: US 6,943,412 B1
(45) Date of Patent: Sep. 13, 2005

(54) SEMICONDUCTOR INTEGRATED CIRCUIT (75) Inventor: Yoko Horiguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/615,705

(22) Filed: Jul. 13, 2000

(30) Foreign Application Priority Data

Aug. 20, 1999 (JP) .................................. 11-234811

(51) Int. Cl.$^7$ ............................................. H01L 23/62
(52) U.S. Cl. ........................ 257/360; 257/355; 257/356
(58) Field of Search ............................... 257/355–363; 361/56

(56) References Cited

U.S. PATENT DOCUMENTS

| | | | | |
|---|---|---|---|---|
| 4,044,373 A | * | 8/1977 | Nomiya et al. | ................ 357/41 |
| 4,288,829 A | * | 9/1981 | Tango | .......................... 361/56 |
| 4,423,431 A | * | 12/1983 | Sasaki | ........................ 357/41 |
| 4,456,939 A | * | 6/1984 | Ozaki et al. | ................... 361/56 |
| 4,656,491 A | * | 4/1987 | Igarashi | .................... 357/23.13 |
| 4,786,956 A | * | 11/1988 | Puar | ........................ 357/23.13 |
| 5,255,146 A | * | 10/1993 | Miller | .......................... 361/56 |
| 5,440,162 A | * | 8/1995 | Workey et al. | .............. 257/355 |
| 5,535,134 A | * | 7/1996 | Cohn et al. | .................. 364/491 |
| 5,828,095 A | * | 10/1998 | Merritt | ........................ 257/299 |
| 6,125,021 A | * | 9/2000 | Duvvury et al. | ............... 361/56 |

FOREIGN PATENT DOCUMENTS

| | | | | | |
|---|---|---|---|---|---|
| JP | 2-2201 | * | 1/1990 | ............ | H01L 17/00 |
| JP | 3-183207 | * | 8/1991 | ............. | H01L 7/06 |
| JP | 4-22886 | * | 1/1992 | ............ | H01L 31/26 |
| JP | 4-196352 | | 7/1992 | | |
| JP | 7-193195 | | 7/1995 | | |
| JP | 11-154733 | * | 6/1999 | ............ | H01L 27/04 |

* cited by examiner

Primary Examiner—Ori Nadav
(74) Attorney, Agent, or Firm—Sughrue Mion, PLLC (57) ABSTRACT A semiconductor integrated circuit is provided, which has an improved withstanding voltage for electrostatic breakdown at the time of electrostatic discharge by the charged device model, in the case of protecting a MOS capacitor provided at the input side of the internal circuit. The semiconductor integrated circuit comprises an internal circuit 20 for inputting an external signal, an internal circuit MOS capacitor 16, one end of which is connected to a power source wire 10 for supplying the source voltage and the other end of which is connected to a ground potential wire 12 for supplying the ground potential; a ground terminal 14 to which one end of the ground potential wire is connected; an electrostatic protection element 18 connected in parallel with the MOS capacitor 16 between the ground terminal 14 and the MOS capacitor, wherein the MOS capacitor and the electrostatic protection element are connected between the power source wire and the ground potential wire such that the wire resistance R1 of the ground potential wire between the ground terminal and the connection point with one end of the electrostatic protection element is larger than the wire resistance R2 of the ground potential wire between the connection point with one end of the electrostatic protection element and the connection point with one end of the MOS capacitor.

17 Claims, 9 Drawing Sheets

SEMICONDUCTOR INTEGRATED CIRCUIT

BACKGROUND OF THE INVENTION

1. Field of the Invention

The present invention relates to a semiconductor integrated circuit, and in particular, relates to a semiconductor integrated circuit capable of preventing electrostatic breakdown caused by the electrostatic discharge by the charged device model.

2. Background Art

As the semiconductor integrated circuits becomes finer, and the level of integration advances, a phenomenon called ESD (electro-static discharge) becomes an important issue, because electrostatic breakdown is caused by the electrostatic charge. As is well known, three models including a human-body model (HBM), a machine model (MM), and a charged device model (CDM) have been proposed for explaining the generation of the electro-static charge breakdown. The human body model is a model in which the breakdown of the device is caused by the discharge of an electrostatic charge accumulated in a human body to the device when the human body touches the device. The machine model is a model in which the electrostatic breakdown is generated when a machine made of metal and having a higher electric capacitance but a lower discharge resistance is in contact with the device. The evaluations of the human body model and the machine model are carried out by discharging static electricity applied between two test terminals of the device.

The charged device model is a breakdown model in which breakdown is caused by discharge of the electric charge accumulated on the package or the lead frames of the device by, for example, friction through the terminals of the device.

Figure 17:
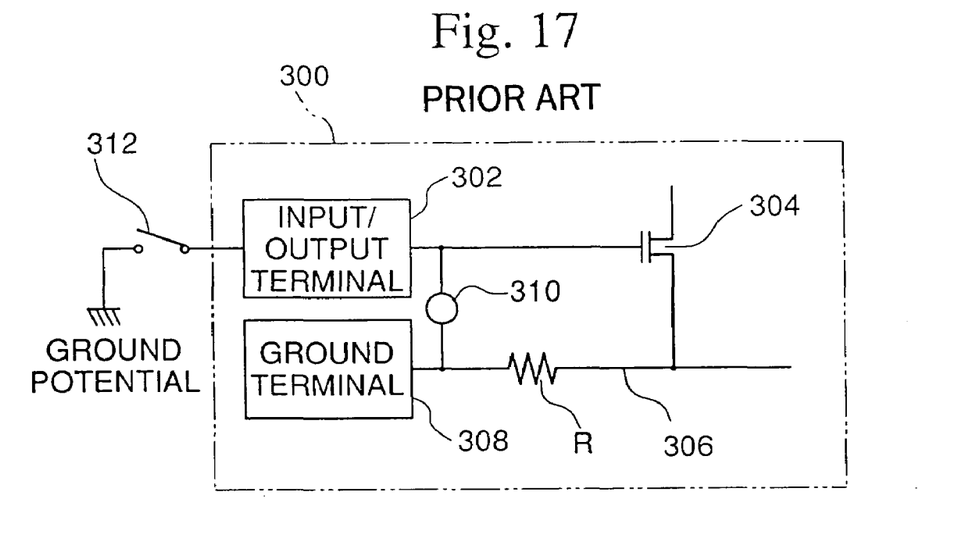
FIG. 17 is a block diagram for explaining the electrostatic breakdown of the conventional semiconductor integrated circuit device by the charged device model.
Figure 18:
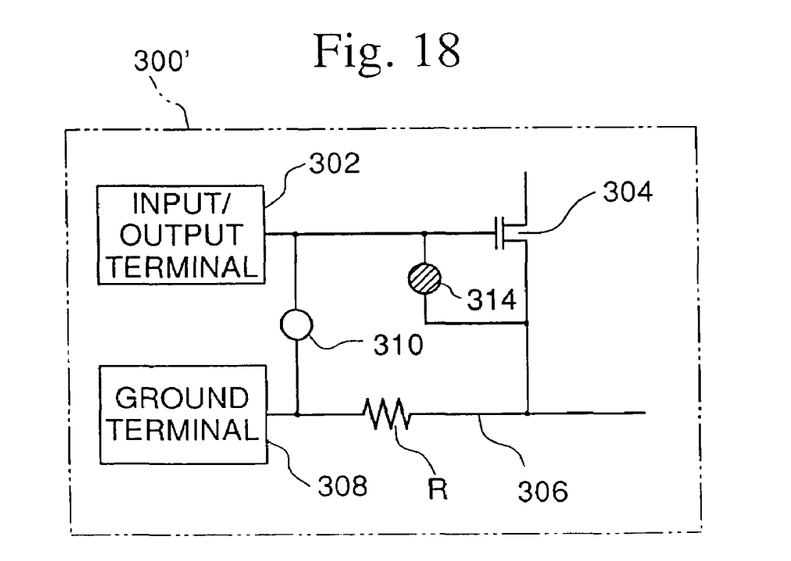
FIG. 18 is a block diagram for explaining the mechanism and a general measure for the electrostatic breakdown of the conventional semiconductor integrated circuit device by the charged device model.

As automatic manufacturing processes advance, semiconductor integrated devices often become defective products because of electrification of the devices according to the charged device model by friction or contact with manufacturing equipment during automated test processes and automated assembly processes for electronic machines. The electrostatic breakdown mechanism by the charged device model (CDM) in the conventional semiconductor integrated circuits and its general measure will be described hereinafter. In FIG. 17, an input/output terminal 302 of a semiconductor integrated circuit 300 is connected with a gate of the MOS transistor 304 which constitutes an internal circuit. The source of the MOS transistor 304 is connected with the ground terminal 308 through the ground wiring 306.

An electrostatic protection element 310 is connected between the input/output terminal 302 and the ground terminal 308 and the input/output terminal 302 for testing the electrostatic breakdown mechanism of the charged device model is connected to connected to ground through a switch 312. The electrostatic protection element 310 is provided in order to protect the MOS transistor 304 which constitute the internal circuit from breaking down when the static electricity is externally applied to the input/output terminal 302. This protection element is provided so as to protect against the breakdown by the human body model or the machine model.

In contrast, in the mechanism of the breakdown by the charged device model, it is assumed that when the potential of an input/output terminal falls to the ground potential, while the device is charged by electrification for some reason, the charge of the device is discharged to the ground through the electrostatic protection element 310. At this time, the electric charge accumulated at the gate of the MOS transistor connected to the input/output terminal 302 as shown in FIG. 17 is discharged to the ground from the input/output terminal 302. The charge accumulated at the gate of the MOS transistor 304 which constitutes the internal circuit, is extremely small when compared to the charge accumulated at the ground line wiring 306, so that this charge at the gate of the MOS transistor 304 is discharged within a extremely short period and the gate potential becomes the ground potential. As a result, a large potential difference is generated between the gate and the source of the MOS transistor of the internal circuit, and dielectric breakdown occurs. The larger the wiring resistance R of the ground potential wiring 306, the easier the dielectric breakdown of the gate of the MOS transistor 304 occurs.

A measure that can be taken to prevent the dielectric breakdown of the gate of the MOS transistor 304 is to provide an electrostatic protection element (a CDM element) 314 close to the gate and the source of the MOS transistor 304 in order to suppress the potential difference between the gate and the source of the MOS transistor below the clamp voltage of the electrostatic protection element 314. It has been a general measure to provide a new electrostatic protection element (the CDM protection element) for preventing the electrostatic breakdown by the charged device model. An example of this type of conventional measure is disclosed, for example, in "Electrical Overstress/Electrostatic Discharge Symposium proceedings, Sep. 27–29, 1988, pp. 220–227.

Figure 15:
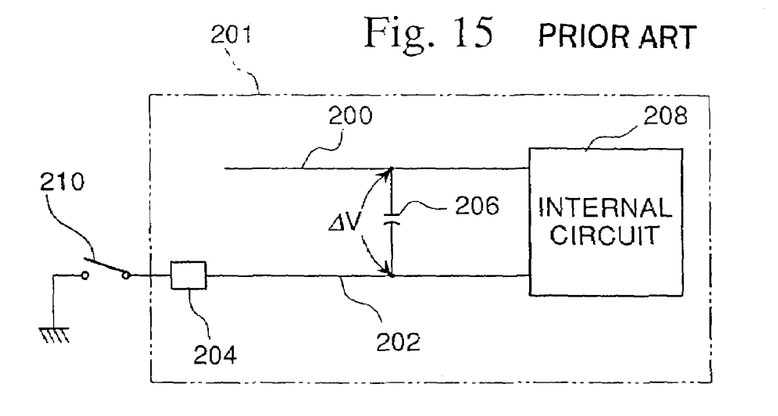
FIG. 15 is a block diagram showing an example of a structure of a conventional semiconductor integrated circuit device.

In contrast, a phenomenon has been observed that the MOS capacitor provided between the source wiring and the ground potential wiring is subjected to the dielectric breakdown. This phenomenon is explained with reference to FIGS. 15 and 16. As shown in FIG. 15, the semiconductor integrated circuit device 201 has an internal circuit 208, and one end of the power source wire 200 for supplying the source voltage is connected to one end of the ground potential wire 202, to which the ground potential is supplied. A MOS capacitor 206 having the function of suppressing the fluctuation of the source voltage to be supplied to the internal circuit is provided between the power source wire 200 and the ground potential wire 202, and the other end of the ground potential wire 202 is connected to the ground terminal 204. In FIG. 15, in order to explain this phenomenon, the ground terminal 204 is connected to ground through the discharge test switch 210.

Figure 16:
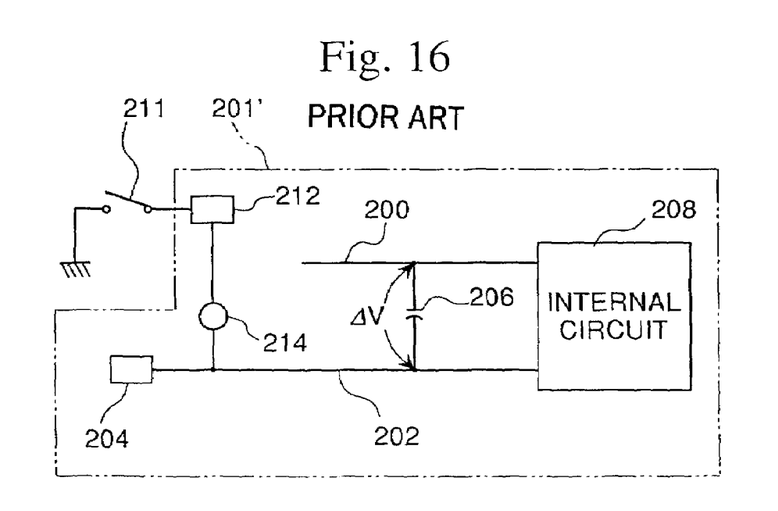
FIG. 16 is a block diagram showing the other example of a structure of a conventional semiconductor integrated circuit device.

In the semiconductor integrated circuit device 201' shown in FIG. 16, the internal circuit 208 is connected with the power source wire 200 and the ground potential wire 202, and the internal circuit 208 comprises a MOS capacitor connected between the power source wire 200 and the ground potential wire 200, and the other end of the ground potential wire 202 is connected to the ground terminal 204. Moreover, the semiconductor integrated circuit device 201' comprises a input/output terminal 212, which is connected to the ground potential wire 202 through an electrostatic protection element 214. Similar to FIG. 15, the input/output terminal 212 is connected to ground through the discharge test switch 211.

Here, the MOS capacitor 206 is provided in most cases in order to suppress the fluctuation of the source voltage applied to the internal circuit 208.

The charge of the devices 201 and 201' accumulated by electrification is discharged as follows; the charge accumulated in the semiconductor integrated circuit device 201 is discharged to the ground through the discharge test switch 210 by turning on the discharge test switch 210 from the ground terminal 204, and the charge accumulated in the semiconductor integrated circuit device 201' is discharged to the ground through the discharge test switch 211 by turning on the discharge test switch 210 from the input/output terminal 212. At this time, in the semiconductor integrated circuit device 201, the electric charge accumulated in a capacitance held by the ground potential wire 202 is discharged from the ground terminal 204 through a switch 210, and the electric charge charged in the capacitance held by the power source wire 200 is discharged through circuit elements connected to the power source wire 200.

In the above case, since the discharge speed of the charge charged in the capacitance held by the ground potential wire 202 from the ground terminal 204 is slower than the discharge speed of the charge charged in the capacitance held by the power source wire 200 from the ground terminal through circuit elements, a potential difference ΔV is generated between both terminals of the MOS capacitor 206. If the potential difference ΔV exceeds the electrostatic breakdown voltage, the MOS capacitor is subjected to electrostatic breakdown.

Similarly, in the semiconductor integrated circuit device 201', the discharge speed of the charge charged in the ground potential wire 202 from the input/output terminal 212 through the electrostatic protection element 214 is slower than the discharge speed of the charge charged in the power source wire 200 from the input/output terminal 212 through the circuit elements, a potential difference ΔV is generated between both terminals of the MOS capacitor 206. If the potential difference ΔV exceeds the electrostatic breakdown voltage, the MOS capacitor 206 is subjected to the electrostatic breakdown.

The potential difference ΔV between both terminals of the MOS capacitor in the semiconductor integrated circuit device 201' is smaller by a voltage corresponding to the clamp voltage of the electrostatic protection element 214 than the potential difference in the semiconductor integrated circuit device 201.

Conventional techniques about the effect of electrostatic protection elements provided as measures for coping with the above-described HBM and MM and the wire resistance of the ground potential wire 202 on the withstanding potential for the electrostatic breakdown (ESD) are disclosed in documents concerning semiconductor integrated circuit devices including Japanese Examined Patent Application, Second Publication No. Hei 7-24310, Japanese Patent (Granted) Publication No. 2650276, and Japanese Unexamined Patent Application, First Publication No. Hei 7-183457.

Those inventions differs from the electrostatic breakdown of the semiconductor integrated circuit devices due to the charged device models, which is the subject of the present invention. The electrostatic breakdown due to the charged device model can be simulated by electrostatic discharge tests by discharging the charge accumulated in the charged device through the test terminal.

Japanese Unexamined Patent Application, First Publication No. Hei 7-183457 describes (in the subjects to be solved) a case in which "when an extraordinary voltage having a very rapid rise such as the case of CDM is applied to the input terminal". However, that application describes only about the breakdown due to HBM and MM, not including breakdown due to CDM.

Thus, since the above described conventional techniques (Japanese Examined Patent Application, Second Publication No. Hei 7-24310, Japanese Patent (Granted) Publication No. 2650276, and Japanese Unexamined Patent Application, First Publication No. Hei 7-183457) do not relate to the CDM which is the breakdown model of the semiconductor integrated circuit of the present invention, the discharge path in the semiconductor integrated circuit of the present invention during electrostatic breakdown differs from those of the conventional integrated circuits. In addition, in contrast to the present application, which used the MOS capacitor provided between the power source wire and the ground potential wire as the element subjected to protection against electrostatic breakdown, the conventional techniques make use of the gate of the MOS transistor located in between the input/output terminals and the ground potential wire.

SUMMARY OF THE INVENTION

It is therefore an objective of the present invention to provide an semiconductor integrated circuit which has an improved withstanding voltage for the electrostatic breakdown according to the charged device model by connecting a MOS capacitor between the power source wire and the ground potential wire as the element to be protected.

The first aspect of the present invention provides a semiconductor integrated circuit device comprising: a MOS capacitor, one end of which is connected to a power source wire for supplying a power source voltage, and another end of which is connected to a ground potential wire for supplying a ground potential; a ground terminal, to which said ground potential wire is connected; and an electrostatic protection element connected in parallel with said MOS capacitor between said ground terminal and said MOS capacitor; wherein a wire resistance of said ground potential between said ground terminal and a connection point on said ground wire with one end of said electrostatic protection element is larger than the wire resistance of said ground potential wire between said connection point on said ground potential wire with one end of said electrostatic protection element and a connection point on said ground potential wire with the other end of said MOS capacitor.

The second aspect of the present invention provides a semiconductor integrated circuit device comprising: an electrostatic protection element, one end of which is connected to a power source wire for supplying a power source voltage, and another end of which is connected to a ground potential wire for supplying a ground potential; a ground terminal, to which said ground potential wire is connected; and a MOS capacitor connected in parallel with said MOS capacitor between said ground terminal and said MOS capacitor; wherein a wire resistance of said ground potential between a connection point on said ground wire with one end of said MOS capacitor and said ground terminal is larger than the wire resistance of the ground potential wire between said connection point on said ground potential wire with one end of said MOS capacitor and a connection point on said ground potential wire with the other end of said electrostatic protection element.

According to the third aspect, in a semiconductor integrated circuit device, no other diffusion layer except said electrostatic protection element is connected on said ground potential wire between said ground terminal and the connection point on said ground potential wire with one end of the MOS capacitor.

The fourth aspect of the present invention provides a semiconductor integrated circuit device comprising: an input/output terminal; a first electrostatic protection element, one end of which is connected to said input/output terminal and another end of which is connected to a ground potential wire for supplying the ground potential; a MOS capacitor, one end of which is connected to a power source wire for supplying the power source voltage and another end of which is connected to the ground potential wire; and a second electrostatic protection element connected in parallel with said MOS capacitor between said first electrostatic protection element and said MOS capacitor; wherein a wire resistance of the ground potential wire between the connection point on the ground potential wire with the other end of said first electrostatic protection element and the connection point on the ground potential wire with one end of said second electrostatic protection element is larger than the wire resistance of the ground potential wire between the connection point on the ground potential wire with the one end of said second electrostatic protection element and the connection point on the ground potential wire with the other end of said MOS capacitor.

The fifth aspect of the present invention provides a semiconductor integrated circuit device comprising: an input/output terminal; a first electrostatic protection element, one end of which is connected to said input/output terminal and another end of which is connected to a ground potential wire for supplying the ground potential; a second electrostatic protection element one end of which is connected to said input/output terminal and another end of which is connected to a ground potential wire for supplying the ground potential; and a MOS capacitor connected in parallel with said second electrostatic protection element between said first electrostatic protection element and said second electrostatic protection element; wherein a wire resistance of the ground potential wire between the connection point on the ground potential wire with the other end of said first electrostatic protection element and the connection point on the ground potential wire with one end of said MOS capacitor is larger than the wire resistance of the ground potential wire between the connection point on the ground potential wire with the one end of said MOS capacitor and the connection point on the ground potential wire with the other end of said second electrostatic protection element.

According to the sixth aspect of the present invention, in a semiconductor integrated circuit device, no other diffusion layer except said first electrostatic protection element is connected on said ground potential wire between the connection point on the ground potential wire with the other end of said first electrostatic protection element and the connection point on said ground potential wire with one end of the MOS capacitor.

According to the seventh aspect, the semiconductor integrated circuit device comprises: a first and second commonly connected ground potential wires for supplying a ground potential and an input/output terminal; an electrostatic protection element, one end of which is connected to said input/output terminal and another end of which is connected to said first ground potential wire; and a MOS capacitor, one end of which is connected to the power source wire for supplying the power source voltage and another end of which is connected to said second ground potential wire; said second ground potential wire is not connected to the input/output terminal and a diffusion layer is connected to said second ground potential wire between said ground terminal and the connection point on said second ground potential wire with the other end of said MOS capacitor.

According to the eighth aspect, said power source wire is connected to the power source terminal, to which a predetermined power source voltage is supplied.

According to the ninth aspect, said power source wire is connected to the power source terminal, to which a first power source voltage is supplied, through a power source conversion circuit for converting said first power source voltage.

According to the tenth aspect, said electrostatic protection element clamps a voltage applied to both terminals at a clamp voltage, which is lower than the dielectric breakdown voltage of said MOS capacitor.

According to the eleventh aspect, said second electrostatic protection element clamps a voltage applied to both terminals at a clamp voltage, which is lower than the dielectric breakdown voltage of said MOS capacitor.

According to the twelfth aspect, said electrostatic protection element is a MOS field effect transistor, the drain of which is connected to said power source wire, and the source and the drain of which are connected to said ground potential wire.

According to the thirteenth aspect, said second electrostatic protection element is a MOS field effect transistor, the drain of which is connected to said power source wire, and the source and the drain of which are connected to said ground potential wire.

According to the fourteenth aspect, said electrostatic protection element is a bipolar transistor, constituted by forming on a substrate having a first conductive type two diffusion layers having a second conductive type, an opposite conductive type to the first conductive type, closely so as to face each other.

According to the fifteenth aspect, said second electrostatic protection element is a bipolar transistor, constituted by forming on a substrate having a first conductive type two diffusion layers having a second conductive type, an opposite conductive type to the first conductive type, closely so as to face each other.

According to the sixteenth aspect, said electrostatic protection element is a thyristor, constituted by forming on a substrate having a first conductive type two diffusion layers respectively having a first conductive type and a second conductive type, an opposite conductive type to the first conductive type, closely so as to face each other, and by further forming on a well having the second conductive type formed on said substrate having the first conductive type two diffusion layers respectively having the first conductive type and the second conductive type, closely so as to face each other.

According to the seventeenth aspect, said second electrostatic protection element is a thyristor, constituted by forming on a substrate having a first conductive type two diffusion layers respectively having a first conductive type and a second conductive type, an opposite conductive type to the first conductive type, closely so as to face each other, and by further forming on a well having the second conductive type formed on said substrate having the first conductive type two diffusion layers respectively having the first conductive type and the second conductive type, closely so as to face each other.

According to the eighteenth aspect, said electrostatic protection element is a diode, constituted by forming on a substrate or a well having a first conductive type two diffusion layers having a second conductive type, an opposite conductive type to the first conductive type, closely so as to face each other.

According to the nineteenth aspect, said second electrostatic protection element is a diode, constituted by forming on a substrate or a well having a first conductive type two diffusion layers having a second conductive type, an opposite conductive type to the first conductive type, closely so as to face each other.

DETAILED DESCRIPTION OF THE INVENTION

Figure 1:
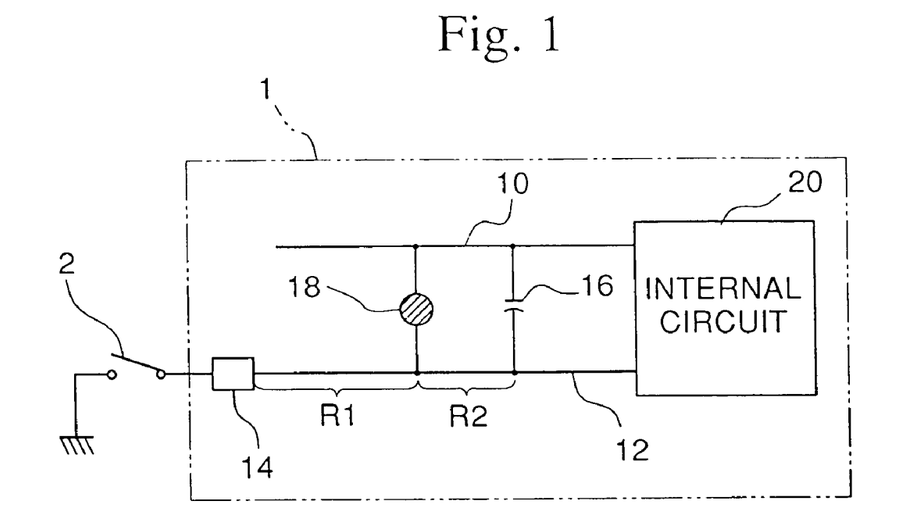
FIG. 1 is a block diagram showing the structure of the semiconductor integrated circuit device according to the first embodiment of the present invention.

Hereinafter, the first embodiment of the present invention is described in detail with reference to the attached drawings. FIG. 1 is a block diagram showing the structure of the semiconductor integrated circuit device according to the first embodiment of the present invention. In FIG. 1, the semiconductor integrated circuit device according to the first embodiment comprises an internal circuit 20, to which a power source wire 10 for supplying the source voltage and the ground potential wire 12 for supplying the ground potential are connected. Furthermore, the ground potential wire 12 is connected to the ground terminal 14. Here, in order to explain the phenomenon of the CDM test, the above ground terminal 14 is grounded through a discharge test switch.

As shown in FIG. 1, a MOS capacitor is provided, one end of which is connected to the power source wire 10, and the other end of which is connected to the ground potential wire 12. The MOS capacitor is provided in general for suppressing the fluctuation of the source voltage supplied to the internal circuit 20.

An electrostatic protection element (CDM protection element) 18 is provided between the ground terminal 14 and the MOS capacitor 16 in parallel to the MOS capacitor 16. This electrostatic protection element 18 has a function of clamping the voltage generated between both terminals of the MOS capacitor 16 at the time of the CDM test be a voltage lower than the dielectric breakdown voltage. This electrostatic protection element 18 is, for example, a MOS field effect transistor, the drain of which is connected to the power source wire 10 and the source and gate of which are connected to the ground potential wire 12. It is noted that the electrostatic protection element is not limited to a field effect transistor, but a bipolar transistor, a thyristor or a diode (excluding a parasitic diode) may be used as the electrostatic protection element 18.

One end of both the MOS capacitor 16 and electrostatic protection element 18 are connected to the ground potential wire 12 such that the wire resistance R1 of the ground potential wire between the ground terminal 14 and the connection point of the wire connected to one end of the electrostatic protection element 18 is larger than the wire resistance between the connection point of the wire connected to one end of the electrostatic protection element 18 and the connection point of the wire connected to one end of the MOS capacitor 16.

In addition, the semiconductor integrated circuit device according to this embodiment is constituted such that no other diffusion layer except the above described electrostatic protection element is connected on the ground potential wire 12 in between the ground terminal 14 and the connection point of one end of the MOS capacitor 16.

Figure 2:
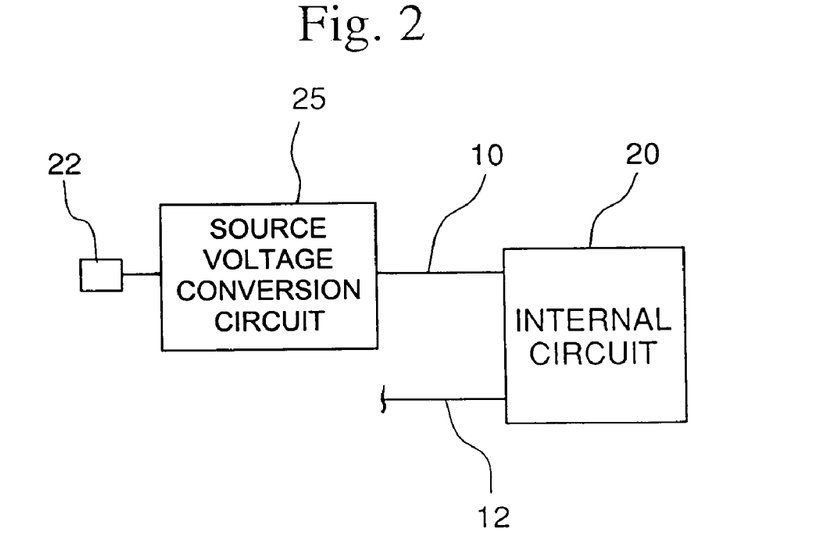
FIG. 2 is a block diagram showing another example of a power source supply line of the power source wire in FIG. 1.

It is noted that the power source wire 10 may be connected directly to the source terminal for supplying the predetermined source voltage or may be connected to the source terminal 22 through a source voltage conversion circuit 25 for boosting or depressing the source voltage as shown in FIG. 2.

When the discharge test switch 2 is turned on after the semiconductor integrated circuit device according to the first embodiment is subjected to electrification, the charge charged in the capacitance held by the ground potential wire 12 from the ground terminal 14 is discharged to the ground. At this time, the voltage between both terminals of the MOS capacitor is clamped at a voltage lower than the dielectric breakdown voltage by the electrostatic protection element 18. Thus, the MOS capacitor is protected from the electrostatic breakdown.

Here, the wire resistance of the ground potential wire 12 must be taken into consideration in order to protect the MOS capacitor. That is, in order to protect the MOS capacitor from electrostatic breakdown by the charged device model, it is necessary to satisfy the following equation (1), $$VC + R2 \cdot i < VOX$$

wherein VC is the clamp voltage of the electrostatic protection element 18, i is a current flowing in the wire resistance R2 of the ground potential wire 12 at the time of the electrostatic discharge test, and VOX is the dielectric breakdown voltage of the MOS capacitor 16. The above equation (1) indicates that the wire resistance should be as low as possible, but the wire resistance is not required to be zero.

In contrast, the wire resistance R1 of the ground potential wire 12 must have a resistance of a certain amount. If the wire resistance R1 is zero, it is possible that the MOS capacitor is subjected to electrostatic breakdown before electrostatic protection element 18 starts the clamping action. Thus, in order to execute reliable protection of the MOS capacitor, the wire resistance R1 must have a certain resistance within a range without interfering the circuit performance. Since it is preferable for the wire resistance R2 to be as low as possible, the wire resistances of R1 and R2 must satisfy the relationship R1>R2.

Figure 7:
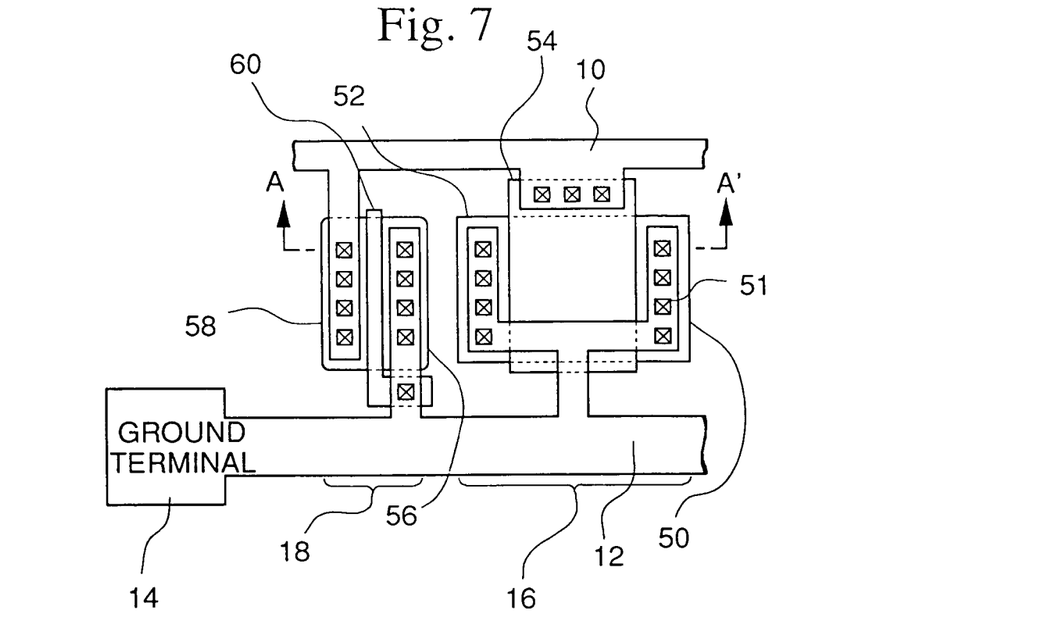
FIG. 7 is a plan view showing the structure of the main portion of the semiconductor integrated circuit device shown in FIG. 1
Figure 8:
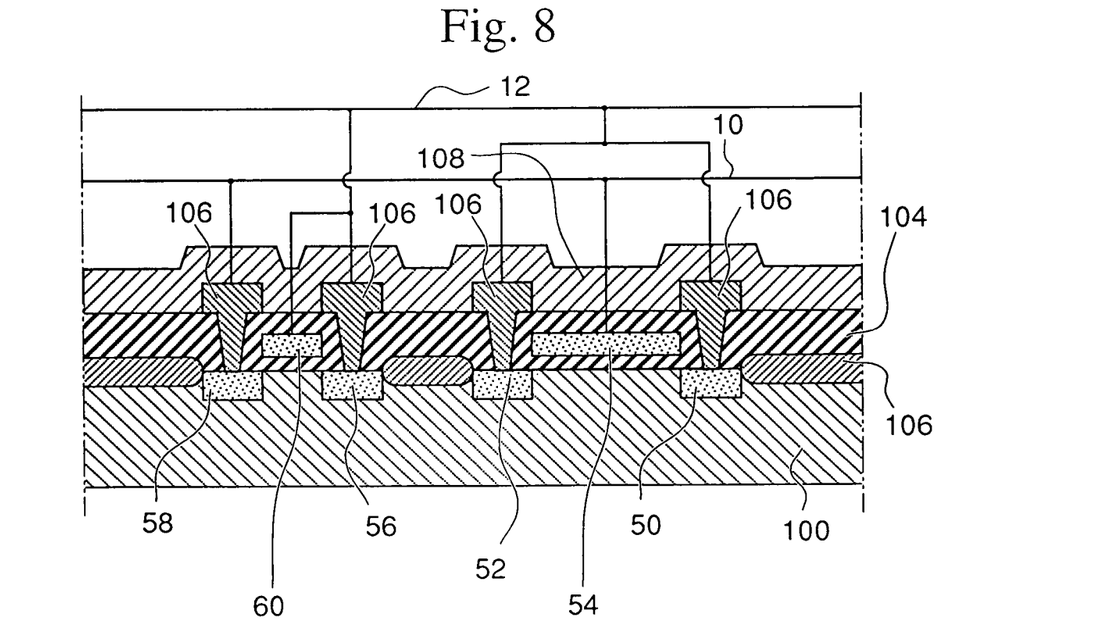
FIG. 8 is a cross-sectional view along the A-A' line is FIG. 7.

A plan view of an example of the structure of the main portion of the semiconductor integrated circuit device, shown in FIG. 1, according to the first embodiment is shown in FIG. 7 and a cross-sectional view along the A-A' line is shown in FIG. 8. In FIGS. 7 and 8, the MOS capacitor 16 is constituted by forming $N^+$ diffusion layers 50 and 52, and a gate polysilicon (a gate electrode) 54 on the P-type semiconductor substrate 100.

Adjacent to the MOS capacitor, a MOS transistor (CDM protection element) 18 is constituted by adjacently forming $N^+$ diffusion layers 56 and 58 arranged so as to face each other and the gate polysilicon (the gate electrode) 60. The reference numeral 104 denotes an interlayer insulating film, 106 denotes an aluminum wire, and 108 denotes a passivation film. The $N^+$ diffusion layers 50 and 52 are connected by a contact 51 to the ground potential wire 12 through the aluminum wire 106. The $N^+$ diffusion layers 50 and 52 are connected to the ground potential wire 12 by the contact 51 through the aluminum wire 106, and the gate polysilicon (the gate electrode) 54 is connected to the power source wire 10.

The $N^+$ diffusion layer (the source) 56 and the gate polysilicon (the gate electrode) 60 are commonly connected through the aluminum wire 106 and are connected to the ground potential wire 12. The $N^+$ diffusion layer (the drain) 58 is connected to the power source wire 10 through the aluminum wire 106.

Figure 3:
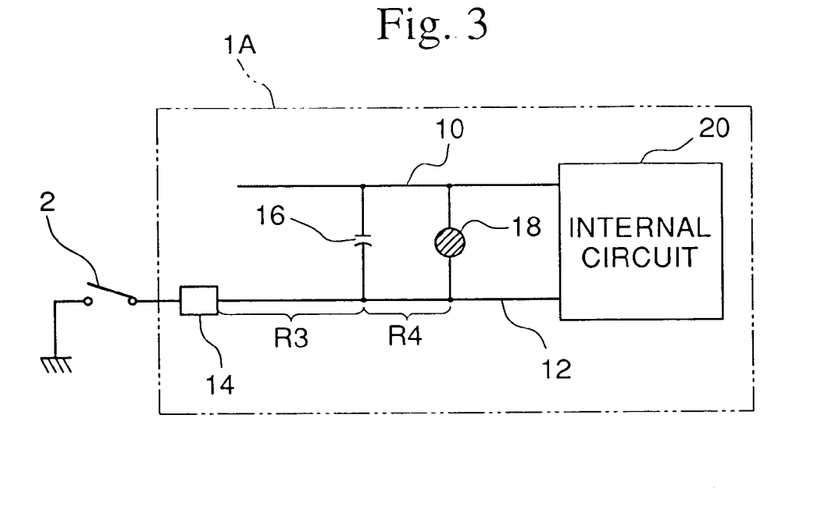
FIG. 3 is a block diagram showing the structure of the semiconductor integrated circuit device according to the second embodiment of the present invention.

Next, the structure of the semiconductor integrated circuit device according to the second embodiment of the present invention is shown in FIG. 3 will be explained. The semiconductor integrated circuit device according to the second embodiment differs from the semiconductor integrated circuit device according to the first embodiment in that the positional relationship between the MOS capacitor 16 and the electrostatic protection element 18, which are connected in parallel between the power source wire 10 and the ground potential wire 12, is reversed from that of the first embodiment. That is, on the ground potential wire, the MOS capacitor 16 is connected between the ground terminal 14 and the electrostatic protection element 18 in parallel to the electrostatic protection element 18. Since the other parts of the structure are the same as for the first embodiment, their explanation is omitted.

It is noted that, similar to the first embodiment, a MOS field effect transistor, a bipolar transistor, a thyristor, or a diode (excluding a parasitic diode) may be used as the electrostatic protection element 18.

The MOS capacitor 16 and the electrostatic protection element 18 are connected to the ground potential wire 12 and the power source wire 10 such that the wire resistance R3 of the ground potential wire 12 between the ground terminal 14 and the connection point with one end of the MOS capacitor 16 becomes larger than the wire resistance R4 of the ground potential wire between the connection point with one end of the MOS capacitor and the connection point with one end of the electrostatic protection element 18. The relationship between the two wire resistances R3 and R4 (R3>R4) is similar to the relationship between the two wire resistances R1 and R2 (R1>R2) of the first embodiment.

Furthermore, similar to the first embodiment, the semiconductor integrated circuit device 1A according to the second embodiment is constituted such that no other diffusion layer except the electrostatic protection element 18 is connected to the ground potential wire 12 between the ground terminal 14 and the connection point with one end of the MOS capacitor 16.

When the discharge test switch 2 is switched to the ON state, after the entire semiconductor integrated circuit device 1A is charged by electrification, the charge accumulated in the capacitance held by the ground potential wire 12 is discharged to the ground from the ground terminal 14.

At this time, the voltage between both terminals of the MOS capacitor 16 is clamped at a voltage lower than the dielectric breakdown voltage of the MOS capacitor 16 by the electrostatic protection element 18. Thus, the MOS capacitor is protected from the electrostatic breakdown.

It is noted that, similar to the first embodiment, the power source wire 10 may be connected to the source terminal, to which the power source voltage is supplied or may be connected to the source terminal 22 through a power source voltage conversion circuit 25 for boosting or depressing the power source voltage as shown in FIG. 2. Since the semiconductor integrated circuit device 1A has a structure in which the MOS capacitor 16 and the electrostatic protection element 18 are disposed in a reversed positional relationship to the first embodiment, a depiction of the plan view and the cross-sectional view of the second embodiment is omitted.

Figure 4:
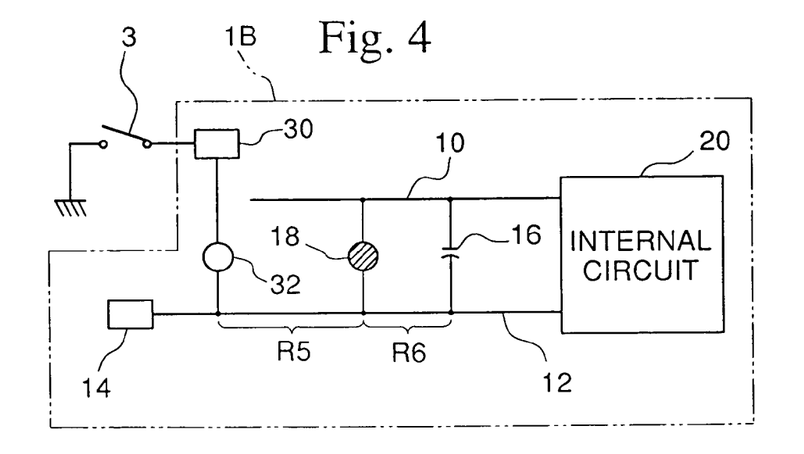
FIG. 4 is a block diagram showing the structure of the semiconductor integrated circuit device according to the third embodiment of the present invention.

Next, a semiconductor integrated circuit device according to the third embodiment of the present invention is illustrated in FIG. 4. As shown in FIG. 4, the semiconductor integrated circuit device 1B comprises an input/output terminal 30, an electrostatic protection element 32, one end of which is connected to the input/output terminal 30 and the other end of which is connected to the ground potential wire 12, and a MOS capacitor 16, one end of which is connected to the power source wire and the other end of which is connected to the ground potential wire 12. The input/output terminal 30 is connected to ground through the discharge test switch 3 for preparing the CDM test. Here, the input/output terminal 30 means an input terminal, an output terminal, or a terminal for use both as input and output (I/O).

The electrostatic protection element (CDM protection circuit) 30 is connected in parallel with the MOS capacitor between the ground terminal and the MOS capacitor 16. This electrostatic protection element 18 has a function to clamp the voltage generated between both terminals of the MOS capacitor at a clamp voltage lower than the dielectric breakdown (electrostatic breakdown) voltage of the MOS capacitor 16. The electrostatic protection element 32 is provided for preventing from the electrostatic breakdown by the human body model or by the machine model, but the electrostatic protection element 18 is provided for preventing from the electrostatic breakdown by the charged device model, similar to the first and second embodiments.

Furthermore, the MOS capacitor 16 and the electrostatic protection element 18 are connected to the power source wire 10 and the ground potential wire 12 such that the wire resistance R5 of the ground potential wire 12 between the connection point on the ground potential wire 12 with one end of the electrostatic protection element 32 and the connection point on the ground potential wire 12 with one end of the electrostatic protection element 18 becomes larger than the wire resistance R6 of the ground potential wire 12 between the connection point on the ground potential wire 12 with one end of the electrostatic element 18 and the connection point on the ground potential wire 12 with one end of the MOS capacitor 16.

Furthermore, the semiconductor integrated circuit device 1B according to the third embodiment is constituted such that no other diffusion layer except the electrostatic protection element 18 is connected to the ground potential wire 12 between the connection point on the ground potential wire 12 with one end of the electrostatic protection element 32 and the connection point on the ground potential wire 12 with one end of the MOS capacitor 16.

It is noted that, in the present embodiment, the power source wire 10 may be connected directly to the source terminal, to which the power source voltage is supplied or may be connected to the source terminal 22 through a power source voltage conversion circuit 25 for boosting or depressing the power source voltage as shown in FIG. 2.

When the discharge test switch 2 is switched to the ON state, after the entire semiconductor integrated circuit device 1B is charged by electrification, the charge accumulated in the capacitance held by the ground potential wire 12 is discharged to the ground from the ground terminal 14. At this time, the voltage between both terminals of the MOS capacitor 16 is clamped at a voltage lower than the dielectric breakdown voltage of the MOS capacitor 16 by the electrostatic protection element 18. Thus, the MOS capacitor is protected from the electrostatic breakdown. Since the relationship between the wire resistance R5 and wire resistance R6 is the same as that of the wire resistances of R1 and R2 in the first embodiment, their explanation is omitted.

Figure 5:
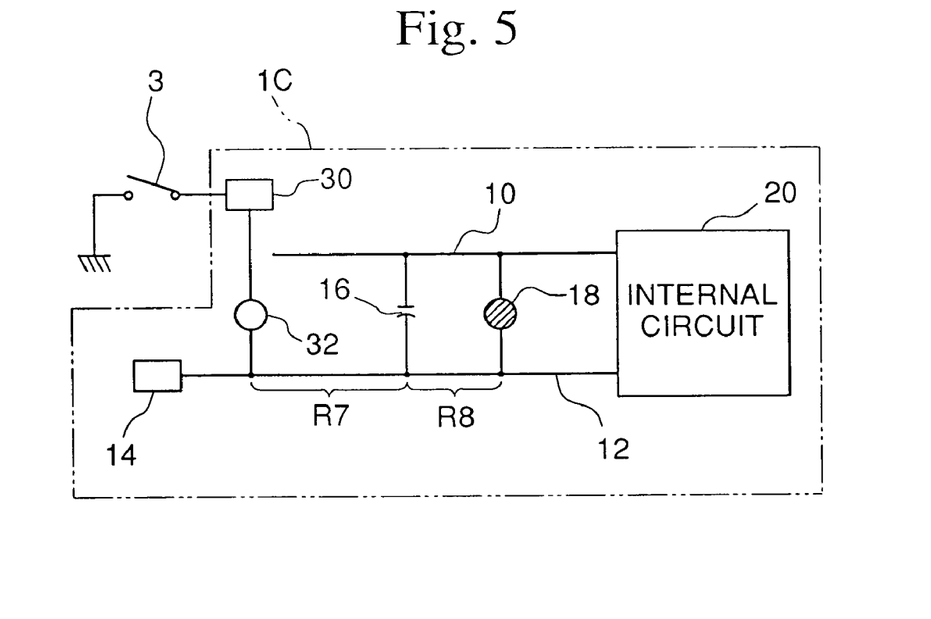
FIG. 5 is a block diagram showing the structure of the semiconductor integrated circuit device according to the fourth embodiment of the present invention.

Next, the structure of a semiconductor integrated circuit device according to the fourth embodiment of the present invention is illustrated in FIG. 5. The structure of the semiconductor integrated circuit device 1C according to the present embodiment differs from the semiconductor integrated circuit device 1B according to the third embodiment in that the MOS capacitor 16 and the electrostatic protection element 18, connected in parallel between the power source wire 10 and the ground potential wire 12, are oppositely disposed to each other. That is, the MOS capacitor 16 is connected in parallel with the electrostatic protection element 18 in between the ground terminal 14 and the electrostatic protection element 18, and the other parts of the structure are the same as for the previous embodiment, their explanation is omitted.

It is noted that a MOS field effect transistor, a bipolar transistor, a thyristor, or a diode (excluding a parasitic diode) may be used as the electrostatic protection element 18.

The MOS capacitor 16 and the electrostatic protection element 18 are connected to the ground potential wire 12 and the power source wire 10 such that the wire resistance R7 of the ground potential wire 12 between the connection point with one end of the electrostatic protection element 32 and the connection point with one end of the MOS capacitor 16 becomes larger than the wire resistance R8 of the ground potential wire 12 between the connection point with one end of the MOS capacitor and the connection point with one end of the electrostatic protection element 18. The relationship between the two wire resistances R7 and R8 (R7>R8) is similar to the relationship between the two wire resistances R1 and R2 (R1>R2) of the first embodiment.

Furthermore, similar to the third embodiment, the semiconductor integrated circuit device ° C. according to the fourth embodiment is constituted such that no other diffusion layer except the electrostatic protection element 18 is connected to the ground potential wire 12 between the ground terminal 14 and the connection point with one end of the MOS capacitor 16.

When the discharge test switch 3 is switched to the ON state, after the entire semiconductor integrated circuit device 1B is charged by electrification, the charge accumulated in the capacitance held by the ground potential wire 12 is discharged to the ground from the ground terminal 14.

At this time, the voltage between both terminals of the MOS capacitor 16 is clamped at a voltage lower than the dielectric breakdown voltage of the MOS capacitor 16 by the electrostatic protection element 18. Thus, the MOS capacitor is protected from electrostatic breakdown.

It is noted that, in the present embodiment, the power source wire 10 may be connected directly to the source terminal, to which the power source voltage is supplied or may be connected to the source terminal 22 through a power source voltage conversion circuit 25 for boosting or depressing the power source voltage as shown in FIG. 2.

Figure 9:
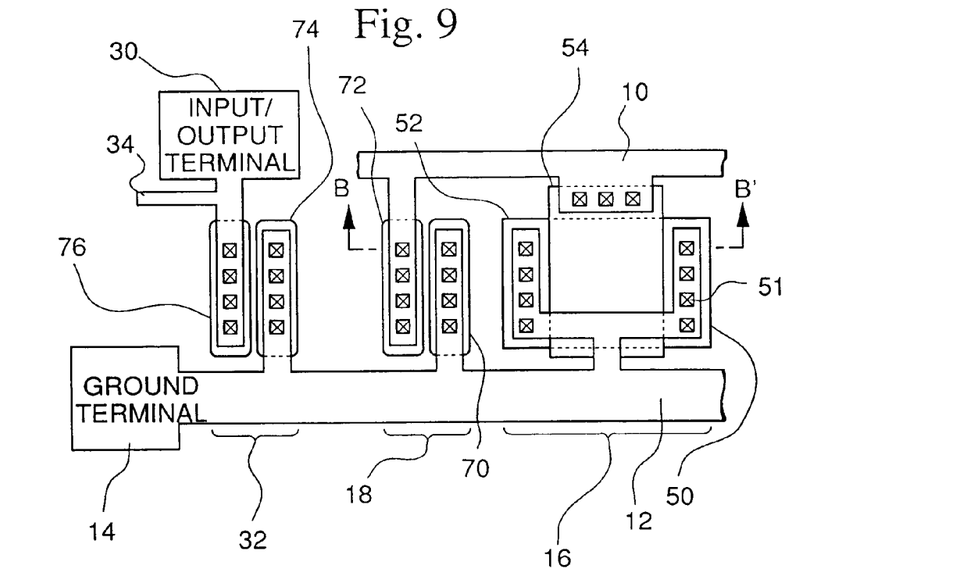
FIG. 9 is a plan view showing an example of the structure of the main portion of the semiconductor integrated circuit device shown in FIG. 4.
Figure 10:
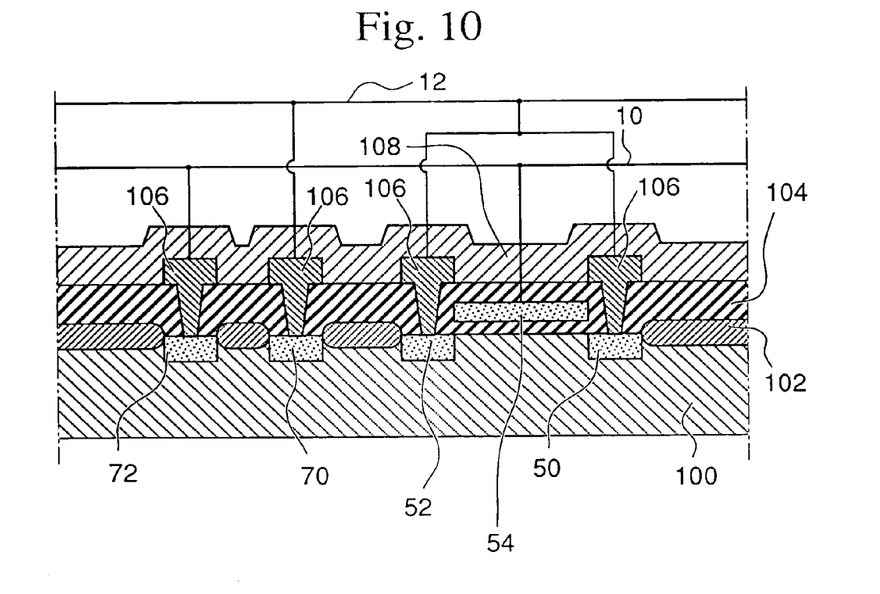
FIG. 10 is a cross-sectional view along the B-B' line in FIG. 9.

A plan view of an example of the main portion of the semiconductor integrated circuit device according to the third embodiment is illustrated in FIG. 9, and the cross-sectional view along the B-B' line of FIG. 9 is shown in FIG. 10. In FIGS. 9 and 10, the MOS capacitor 16 is constituted by forming $N^+$ diffusion layers 50 and 52 and a gate polysilicon (gate electrode) 54 on the P-type semiconductor substrate 100.

Adjacent to the MOS capacitor 16, a bipolar transistor (CDM protection element) 18 is constituted by closely forming two $N^+$ diffusion layers 70 and 72 so as to face each other on the P-type semiconductor substrate. The numeral 104 denotes a interlayer insulating film, 106 denotes an aluminum wire, and 108 denotes a passivation film. The $N^+$ diffusion layers 50 and 52 are connected to the ground potential wire 12 by the contact 51 through the aluminum wire, and the gate polysilicon (gate electrode) 54 is connected to the power source wire 10.

The $N^+$ diffusion layer 70 is connected to the ground potential wire 12 through the aluminum wire 106 and the $N^+$ diffusion layer 72 is connected to the power source wire 10 through the aluminum wire 106.

Furthermore, as shown in FIG. 9, a bipolar transistor is constituted by closely forming $N^+$ diffusion layers 74 and 76 so as to face each other. This bipolar transistor constitutes electrostatic protection element 32, the $N^+$ diffusion layer 74 connected to the ground potential wire 12, and the $N^+$ diffusion layer 76 is connected to the input/output terminal 30. As shown in FIG. 9, a wire 34 to the internal circuit 20 is connected to the input/output terminal 30 in addition to the electrostatic protection element 32.

Figure 11:
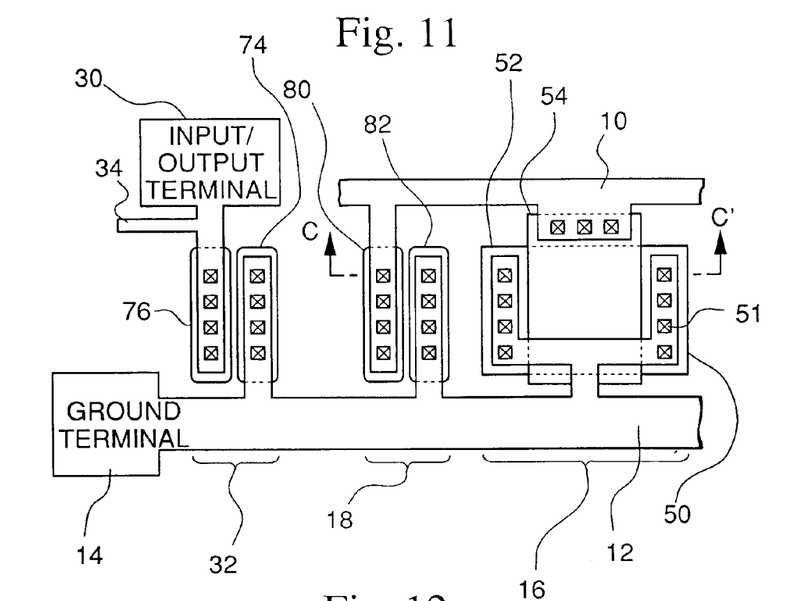
FIG. 11 is a plan view showing the structure of the main portion of the semiconductor integrated circuit device shown in FIG. 4.
Figure 12:
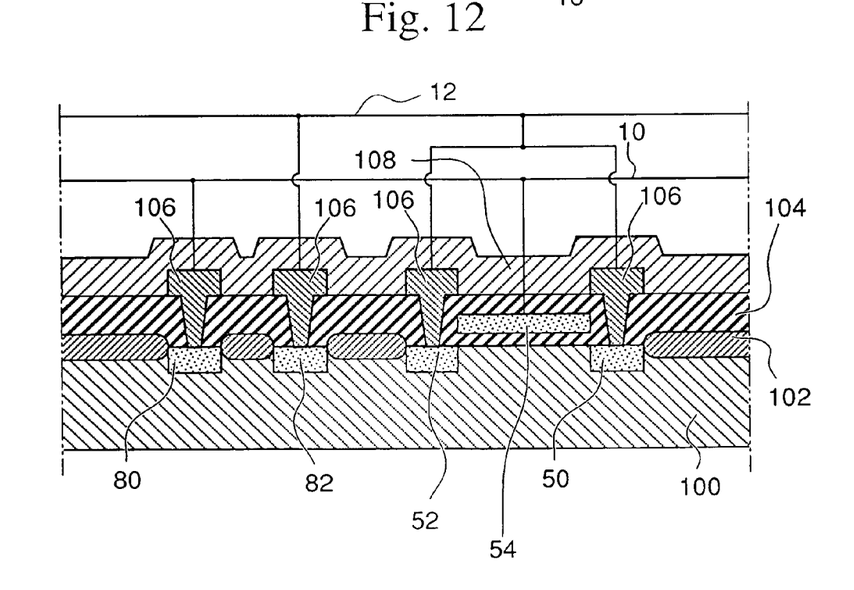
FIG. 12 is a cross-sectional view along the C-C' line in FIG. 11.

A plan view of the other example of the main portion of the semiconductor integrated circuit device 1B according to the third embodiment shown in FIG. 4 is illustrated in FIG. 11, and the cross-sectional view along the B-B' line of FIG. 11 is shown in FIG. 12. The difference between the example shown in FIG. 11 and the example shown in FIG. 9 is that the example shown in FIG. 11 uses a PN diode which is formed by closely forming an $N^+$ diffusion layer 80 and a $P^+$ diffusion layer 82 arranged so as to face each other on the P-type semiconductor substrate 100. Since the other parts of the structure shown in FIG. 11 are the same as that of the structure in FIG. 9, their explanations are omitted. Here, the N⁺ diffusion layer 80 is connected to the power source wire 10 through the aluminum wire 106 and the P⁺ diffusion layer 82 is connected to the ground potential wire 12.

Figure 13:
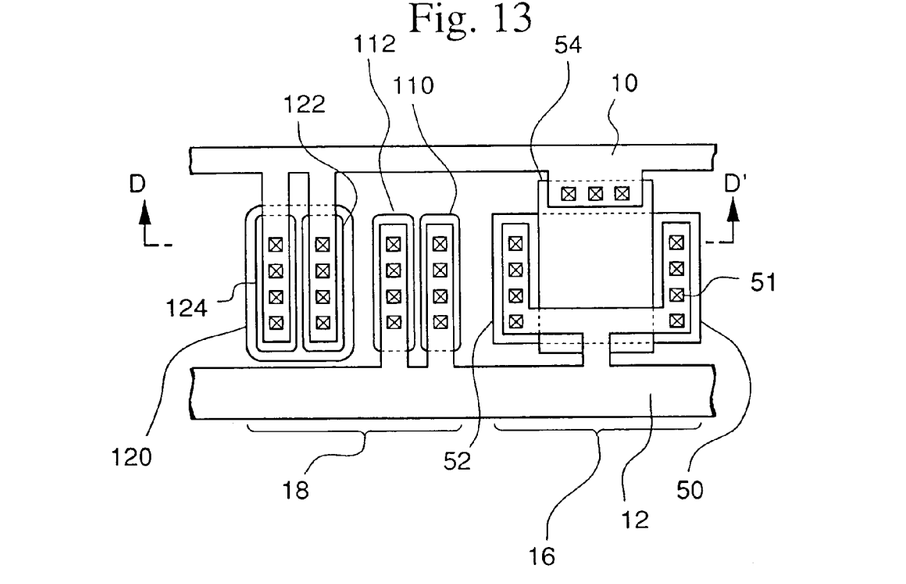
FIG. 13 is a plan view showing the still other example of the structure of the main portion of the semiconductor integrated circuit device shown in FIG. 4.
Figure 14:
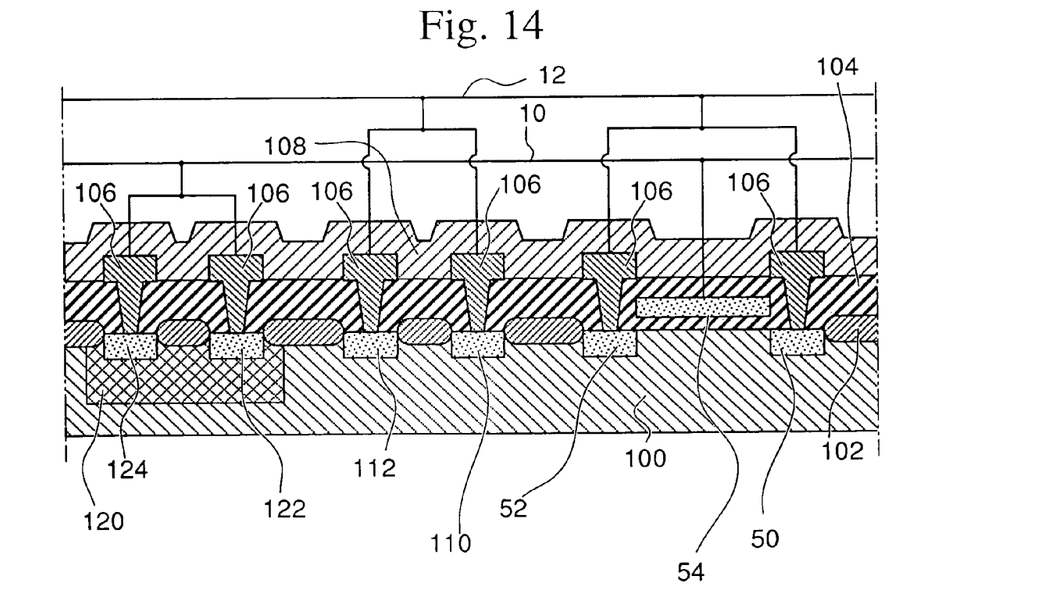
FIG. 14 is a cross-sectional view along the D-D' line in FIG. 13.

The plan view of the other example of the semiconductor integrated circuit device 1B according to the third embodiment shown in FIG. 4 is illustrated in FIG. 13, and the cross sectional view along the C-C' line in FIG. 13 is shown in FIG. 14. The difference between the present example and the example shown in FIGS. 9 and 10 is that the present example uses as the electrostatic protection element (CDM element) 18 a thyristor, constituted by a P+ diffusion layer 110 and an N⁺ diffusion layer 112, an N-well, and a P⁺ diffusion layer 122 and an N⁺ diffusion layer 124, wherein the P⁺ diffusion layer 110 and the N⁺ diffusion layer 112 are formed so as to closely face each other on the P-type semiconductor substrate 100, and the P⁺ diffusion layer 122 and the N⁺ diffusion layer 124 are formed so as to closely face each other in a P-type well 120 formed on the P-type semiconductor substrate 100 adjacent to the N⁺ type diffusion layer 112. Since the other component are the same, the same components are denoted by the same numerals and the repeated explanation is omitted.

The P⁺ diffusion layer 110 and the N⁺ diffusion layer 112 are connected to the ground potential wire, and the P⁺ diffusion layer 122 and the N⁺ diffusion layer 124 are connected to the power source wire 10. It is noted, however, that the arrangement of the N⁺ layer and the P⁺ layer, which constitutes the thyristor, is not limited to that of FIG. 13, but the N⁺ diffusion layer, P⁺ diffusion layer, and the N-well can be suitably rearranged, if the structure possesses the function of the thyristor.

A structure of a semiconductor integrated circuit device 1C according to the fourth embodiment of the present invention is shown in FIG. 5. Since the other arrangements are the same as those of the third embodiment, except that the positional relationship between the MOS capacitor and the electrostatic protection element 18 is reversed, the plan view and the cross-sectional view of this embodiment are omitted.

Figure 6:
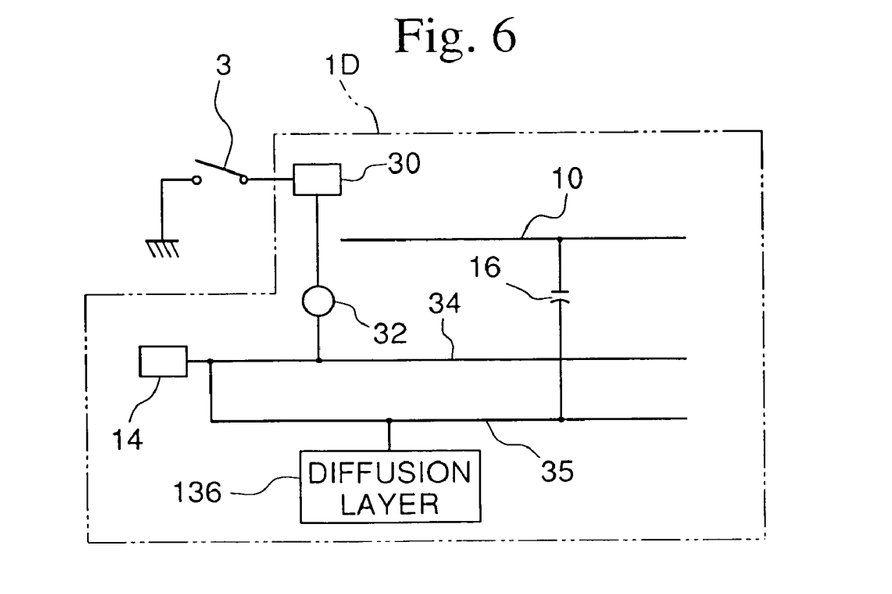
FIG. 6 is a block diagram showing the structure of the semiconductor integrated circuit device according to the fifth embodiment of the present invention.

The structure of a semiconductor integrated circuit element 1D according to the fifth embodiment of the present invention is shown in FIG. 6. As shown in FIG. 6, the semiconductor integrated circuit device 1D comprises an input/output terminal 30 and a ground terminal 14. The semiconductor integrated circuit device 1D further comprises a first ground potential wire 34 for supplying a ground potential and a second ground potential wire 35, connected commonly with the first ground potential wire to the ground terminal 14 for supplying the ground potential.

The semiconductor integrated circuit device 1d comprises the electrostatic protection element 32, one end of which is connected to the input/output terminal 30, and the other end of which is connected to the first ground potential wire 34, and the MOS capacitor, one end of which is connected to the power source wire 10 and the other end of which is connected to the second ground potential wire 35. A diffusion layer 136 is connected to the second ground potential wire 35 located between the ground terminal 14 and the MOS capacitor 16. In addition, it is constituted such that the input/output terminal is connected to ground through the discharge test switch 3 in order to carry out the CDM test.

At the time when the electrostatic discharge test for the present semiconductor integrated circuit device 1D is carried out according to the charged device model, the charge accumulated in the capacitance held by the first ground potential wire is discharged from the input/output terminal through the protection circuit 32. The charge accumulated in the capacitance held by the second ground potential wire 35 and the diffusion layer 136 is also discharged from the input/output terminal through the protection element 32. At this time, since the diffusion layer 136 is connected to the second ground potential circuit 35, the charge present in the semiconductor substrate is discharged, so that the potential difference generated between both terminals of the MOS capacitor is reduced. Therefore, the MOS capacitor 16 is protected from the electrostatic breakdown.

It is noted that the power source wire 10 may be connected directly to the source terminal, to which the power source voltage is supplied, or the power source wire 10 may be connected to the source terminal 22 through the source voltage conversion circuit 25 for boosting or depressing the source voltage.

According to the semiconductor integrated circuit device according to the fifth embodiment of the present invention, the MOS capacitor can be protected from electrostatic charges by the charged device model without separately providing an electrostatic protection element for protecting the MOS capacitor.

It is noted that the CDM protection element for protecting the MOS capacitor from the electrostatic breakdown is not limited to a MOS field effect transistor, a bipolar transistor, a thyristor, or a diode. It may be possible to combine these elements or it may be possible to combine any other additional element in order to increase the acting speed of the device. It is also noted that the power source wire and the ground potential wire are not limited to the aluminum wire, but other materials (such as copper) may be used. The power source wire and the ground potential wire may not be made of the same material, or may not be the wires produced by an identical process.

What is claimed is:

1. A semiconductor integrated circuit device comprising:
   a MOS capacitor, one end of which is connected to a power source wire for supplying a power source voltage, and another end of which is connected to a ground potential wire for supplying a ground potential, said power source wire is connected to a power source terminal, to which a first power source voltage is supplied, through a power source conversion circuit for converting said first power source voltage;
   a ground terminal, to which said ground potential wire is connected; and
   an electrostatic protection element connected in parallel with said MOS capacitor between said ground terminal and said MOS capacitor, said electrostatic protection element protecting said semiconductor integrated circuit device from electrostatic breakdown due to discharge of electric charge accumulated on said semiconductor integrated circuit device according to a charged device model,
   wherein, a wire resistance R1 of said ground potential wire between a connection point on said ground wire with one end of said electrostatic protection element and said ground terminal is larger than a wire resistance R2 of said ground potential wire between said connection point on said ground potential wire with one end of said electrostatic protection element and a connection point on said ground potential wire with the other end of said MOS capacitor, wherein $V_C + R2 \cdot i < V_{OX}$ where $V_C$ is a clamp voltage of said electrostatic protection element;

where $V_{OX}$ is a dielectric breakdown voltage of said MOS capacitor;

where i a current flowing in R2: and where R1>zero and R2>zero.

2. A semiconductor integrated circuit device according to claim 1, wherein no other diffusion layer except said electrostatic protection element is connected on said ground potential wire between said ground terminal and the connection point on said ground potential wire with one end of the MOS capacitor.

3. A semiconductor integrated circuit device according to claim 1, wherein said power source wire is connected to a power source terminal, to which a predetermined power source voltage is supplied.

4. A semiconductor integrated circuit device according to claim 1, wherein said electrostatic protection element clamps a voltage applied across said ground terminal and said power source wire at the clamp voltage, which is lower than the dielectric breakdown voltage of said MOS capacitor.

5. A semiconductor integrated circuit device according to claim 1, wherein said electrostatic protection element is a MOS field effect transistor, a drain of which is connected to said power source wire, and a source and a gate of which are connected to said ground potential wire.

6. A semiconductor integrated circuit device according to claim 1, wherein said electrostatic protection element is a diode, constituted by forming on a substrate or a well having a first conductive type two diffusion layers having a second conductive type, an opposite conductive type to the first conductive type, so as to closely face each other.

7. The semiconductor integrated circuit device according to claim 1, wherein said electrostatic protection element is a bipolar transistor.

8. The semiconductor integrated circuit device according to claim 1, wherein said electrostatic protection element is a thyristor.

9. The semiconductor integrated circuit device according to claim 1, wherein said electrostatic protection element is a diode.

10. A semiconductor integrated circuit device comprising:
a power source wire;
a ground terminal;
a MOS capacitor comprising first and second terminals, wherein said first terminal is connected to a power source wire, wherein said power source wire is connected to a power source terminal and a first power source voltage is supplied through a power source conversion circuit for converting said first power source voltage;
a ground potential wire connected between said ground terminal and said second terminal of said MOS capacitor, wherein said ground potential wire further comprises a connection point disposed between said ground terminal and said second terminal of said MOS capacitor such that the wire resistance R1 between said ground terminal and said connection point is greater than the wire resistance R2 between said second terminal and said connection point; and
an electrostatic protection element connected between said power source wire and said connection point so that said electrostatic protection element is in parallel with said MOS capacitor, said electrostatic protection element protecting said semiconductor integrated circuit device from electrostatic breakdown due to discharge of electrostatic charge accumulated on said semiconductor integrated circuit device according to a charged device model, wherein $V_C + R2 \cdot i < V_{OX}$ where $V_C$ is a clamp voltage of said electrostatic protection element;

where $V_{OX}$ is a dielectric breakdown voltage of said MOS capacitor;

where i a current flowing in R2; and where R1>zero and R2>zero.

11. The semiconductor integrated circuit device according to claim 10, wherein no other diffusion layer except said electrostatic protection element is connected on said ground potential wire between said ground terminal and said connection point on said ground potential wire.

12. The semiconductor integrated circuit device according to claim 10, wherein said power source wire is connected to a power source terminal to which a predetermined power source voltage is supplied.

13. The semiconductor integrated circuit device according to claim 10, wherein said electrostatic protection element clamps a voltage applied across said ground terminal and said power source wire at the clamp voltage, said clamp voltage being lower than a dielectric breakdown voltage of said MOS capacitor.

14. The semiconductor integrated circuit device according to claim 10, wherein said electrostatic protection element is a MOS field effect transistor, a drain of which is connected to said power source wire, and a source and a gate of which are connected to said ground potential wire.

15. The semiconductor integrated circuit device according to claim 10, wherein said electrostatic protection element is a bipolar transistor.

16. The semiconductor integrated circuit device according to claim 10, wherein said electrostatic protection element is a thyristor.

17. The semiconductor integrated circuit device according to claim 10, wherein said electrostatic protection element is a diode.

* * * * *

UNITED STATES PATENT AND TRADEMARK OFFICE
CERTIFICATE OF CORRECTION

PATENT NO. : 6,943,412 B1
APPLICATION NO. : 09/615705
DATED : September 13, 2005
INVENTOR(S) : Yoko Horiguchi

It is certified that error appears in the above-identified patent and that said Letters Patent is hereby corrected as shown below:

Column 12, line 4, delete ""°C" and insert --1C--.

Column 8, line 64, delete "VC+R2·<VOX" and insert --VC+R2·i<VOX--.

Signed and Sealed this

Sixth Day of March, 2007

JON W. DUDAS
*Director of the United States Patent and Trademark Office*